(12) United States Patent
Bedjaoui et al.

(10) Patent No.: US 10,308,001 B2
(45) Date of Patent: Jun. 4, 2019

(54) METHOD FOR MANUFACTURING AN ELECTRONIC DEVICE

(71) Applicant: Commissariat A L'Energie Atomique et aux Energies Alternatives, Paris (FR)

(72) Inventors: Messaoud Bedjaoui, Voreppe (FR); Pierre Garrec, Saint Martin D'Uriage (FR); Sylvain Nizou, Poce sur Cisse (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 369 days.

(21) Appl. No.: 15/192,274

(22) Filed: Jun. 24, 2016

(65) Prior Publication Data

US 2016/0375672 A1    Dec. 29, 2016

(30) Foreign Application Priority Data

Jun. 26, 2015 (FR) ..................... 15 55937

(51) Int. Cl.
*H01G 4/30* (2006.01)
*H01G 4/38* (2006.01)
(Continued)

(52) U.S. Cl.
CPC ............ *B32B 37/12* (2013.01); *G02F 1/1333* (2013.01); *G02F 1/153* (2013.01); *H01G 4/30* (2013.01);
(Continued)

(58) Field of Classification Search
CPC ....... H01L 21/6835; H01L 2221/68304; H01L 2221/68318; H01L 2221/68322;
(Continued)

(56) References Cited

U.S. PATENT DOCUMENTS

| 6,159,323 A | 12/2000 | Joly et al. |
| 2006/0081978 A1 | 4/2006 | Huang et al. |

(Continued)

FOREIGN PATENT DOCUMENTS

| FR | 2 771 852 A1 | 6/1999 |
| WO | WO 2013/119737 A2 | 8/2013 |

OTHER PUBLICATIONS

French Preliminary Search Report dated May 24, 2016 in French Application 15 55937, filed on Jun. 26, 2015 ( with English Translation of Categories of Cited Documents and Written opinion).

*Primary Examiner* — Carson Gross
(74) *Attorney, Agent, or Firm* — Oblon, McClelland, Maier & Neustadt, L.L.P.

(57) ABSTRACT

A method for manufacturing an electronic device including a substrate, including assembling the substrate, by a joining zone of a first face of the substrate, with a joining zone of a first face of a carrier, and disjoining the substrate relatively to the carrier. After the step of assembling, the method includes formation of a film on the substrate, the film being configured to adhere to an adhesion zone of a second face of the substrate opposite the first face of the substrate, the adhesive force between the film and the adhesion zone of the second face of the substrate being chosen greater than the joining force between the joining zone of the carrier and the joining zone of the first face of the substrate. A traction on the film has a force of traction configured to overcome the joining force without overcoming the adhesive force.

19 Claims, 6 Drawing Sheets

(51) Int. Cl.

| | | |
|---|---|---|
| *H01M 2/02* | (2006.01) | |
| *H01M 6/02* | (2006.01) | |
| *H01M 6/40* | (2006.01) | |
| *B32B 37/12* | (2006.01) | |
| *G02F 1/153* | (2006.01) | |
| *H01G 11/10* | (2013.01) | |
| *H01G 11/78* | (2013.01) | |
| *H01G 11/84* | (2013.01) | |
| *H01L 51/00* | (2006.01) | |
| *G02F 1/1333* | (2006.01) | |
| *H01L 21/683* | (2006.01) | |
| *H01M 10/052* | (2010.01) | |
| *H01M 10/0585* | (2010.01) | |

(52) U.S. Cl.
CPC .............. *H01G 4/38* (2013.01); *H01G 11/10* (2013.01); *H01G 11/78* (2013.01); *H01G 11/84* (2013.01); *H01L 51/003* (2013.01); *H01M 2/0207* (2013.01); *H01M 6/02* (2013.01); *H01M 6/40* (2013.01); *H01M 10/052* (2013.01); *H01M 10/0585* (2013.01); *B32B 2457/10* (2013.01); *H01L 21/6835* (2013.01); *H01L 2221/6835* (2013.01); *Y02E 60/13* (2013.01)

(58) Field of Classification Search
CPC ... H01L 2221/68327; H01L 2221/6835; H01L 2221/68359; H01L 2221/68372; H01L 2221/68386; H01L 2221/6839; H01L 2221/68395; H01L 51/00; H01G 4/30; H01G 4/306; H01G 4/33; H01G 11/78; H01G 11/82; H01G 11/84; G02F 1/15; G02F 1/153; H01M 2/0207; H01M 6/02; H01M 6/40; H01M 10/0585
See application file for complete search history.

(56) References Cited

U.S. PATENT DOCUMENTS

| | | | |
|---|---|---|---|
| 2009/0075428 | A1 | 3/2009 | Tang et al. |
| 2010/0041181 | A1 | 2/2010 | Huang et al. |
| 2010/0043608 | A1* | 2/2010 | Jakob ............... H01L 21/67132 83/13 |
| 2010/0239907 | A1* | 9/2010 | Izumi .................... H01G 9/016 429/220 |
| 2011/0003435 | A1 | 1/2011 | Tang et al. |
| 2011/0048611 | A1* | 3/2011 | Carre .................. H01L 21/6835 156/73.1 |
| 2011/0159638 | A1 | 6/2011 | Wang |

* cited by examiner ically*

METHOD FOR MANUFACTURING AN ELECTRONIC DEVICE

FIELD OF THE INVENTION

The invention relates to a method for manufacturing an electronic device comprising a substrate.

It relates preferentially to the production of microelectronic devices such as those sensitive in particular to air on thin and ultrathin substrates fixed beforehand onto thick carriers. One of the potential advantageous applications of this technique relates to the solid micro-batteries carried out on substrates for example made of thin and ultrathin glass. More precisely, according to a non-limiting embodiment, the invention proposes a technique for manufacturing a high-performance encapsulation system while still offering a solution for separating individual batteries made on thin and ultrathin substrates. The application to batteries is not limiting.

PRIOR ART

The development and the boom in onboard smart systems are conditioned by the lifting of a certain number of technological barriers. Other than the barriers linked to the active materials constituting microelectronic devices and their methods for implementation and integration, the problem of substrates used as a base for producing microelectronic members is highly determining for these applications. As such, new methods recommend the use of increasingly thin substrates with the purpose of creating microelectronic devices that meet technological criteria such as reduced thickness or flexibility, and industrial criteria such as cost or availability. The main circuits concerned are the devices for storing energy such as micro-batteries typically with lithium, organic electronic components such as OLED (Organic Light-Emitting Diodes), OPV (Organic PhotoVoltaic cells), OPD (Organic PhotoDetectors) and transistors of the TFT type (Thin Film Transistor).

In practice, thin and ultrathin substrates must be handled with extreme precaution due to their mechanical fragility. Indeed, the multiplication, the chaining and the complexity of the steps established during microelectronic methods (such as transfer, deposit, engraving, cleaning, etc.) can be destructive for fragile substrates. This technical difficulty has led to the development of industrial methods allowing for a temporary fastening of fragile substrates on more solid carriers. However, recourse to methods for temporary fastening of thin and ultrathin substrates impose a step of disjoining at the end of the method of production. The method for separating the two substrates is often rather complex, expensive and incompatible with microelectronic devices. By way of example, solutions for the temporary gluing of substrates via surface treatment or by the use of adhesives are incompatible with microelectronic devices that require technological steps carried out at high temperature. As such, document WO-A2-2013119737 proposes a solution for the localized gluing of fragile substrates on substrate carriers. It is based on the carrying out of a suitable surface treatment allowing for a gluing of the underlying portion of the peripheral zones of the components. This method of gluing is incompatible with technologies that require recourse to thermal steps (often at temperatures exceeding 400° C.). The cutting of fragile substrates via trimming allows the components to be released. The depth of the trimming lines made must be identical to the thickness of the fragile substrate which substantially limits the choice of the cutting technique. In addition, the substrate carrier used cannot be reused and the cutting operation requires the protection of the active layers in the absence of the encapsulation layers.

Another common problem with certain circuits used in microelectronic components such as those mentioned hereinabove (of which OLEDs, capacitive cells or others) resides in their very strong sensitivity with regards to oxidizing gases. This sensitivity results in the use of encapsulation systems of which the performance required caries from one application to another. This performance is often expressed in terms of the speed of transmission of the water vapor (WVTR for Water Vapor Transmission Rate) or as the speed of transmission of oxygen (OTR for Oxygen Transmission Rate). Concretely, the levels of the WVTR and OTR barriers required for applications such as micro-batteries with lithium are respectively about $10^{-4}$ g/m²/j and $10^{-4}$ cm³/m²/j. Although the seal obtained is for a large part according to the encapsulation system covering the front face of these components, it also depends on the nature of the substrate used to prevent any degradation which can intervene on the rear face. Generally, a hermetic protection must take into consideration the seal of the two faces of the component in addition to the lateral protection. As such, it is highly recommended to use substrates with humidity and oxygen barrier properties for sensitive applications.

Generally, the problem of carrying out microelectronic devices on a fragile substrate is partially resolved through the use of conveyor systems acting as carriers and which allow for the displacement and the handling of these fragile substrates during the technological steps. The mechanisms of these systems are based on very specific fastening techniques such as electrostatic clamping with electrodes. However, the use of conveyor systems formed by the fastening of the fragile substrates on more solid carriers remains confronted with the difficulties concerning the disjoining of the substrate from the carrier at the end of manufacturing.

This invention makes it possible to totally or partially overcome the currently known technical disadvantages. A solution proposed provides a response to at least one of the aforementioned problems, in particular that of the separation between two parts (a carrier and a substrate) after a step of assembling. Not limitatingly, the invention can at the same time provide a solution of encapsulation. Indeed, the principles of the optional embodiments of this invention relate to the problem of encapsulation of microelectronic devices carried out on substrates, preferably thin and therefore fragile, deliberately fixed on thicker carriers but also to the difficulties of disjoining the bases formed by the fragile substrates and thick carriers.

SUMMARY OF THE INVENTION

An aspect of the embodiments of the invention relates to a method for manufacturing an electronic device comprising a substrate. The method comprises a step of assembling the substrate, by a joining zone of a first face of the substrate, with a joining zone of a first face of a carrier, then a step of disjoining the substrate relatively to the carrier. Advantageously, the method comprises:

after the step of assembling, the forming of a film on the substrate, said film being configured to adhere to an adhesion zone of a second face of the substrate opposite the first face of the substrate, with the adhesive force between the film and the adhesion zone of the second face of the substrate being chosen greater than the joining force between the joining zone of the carrier and the joining zone of the first face of the substrate;

a traction on the film with a force of traction configured to overcome the joining force without overcoming the adhesive force.

According to an optional aspect of the invention, at least one component is formed, at least partially after the step of assembling and before the forming of the film.

Another aspect of the embodiments of the invention relate to a device that can be obtained by the method of the invention. The invention also relates to the use of a film, in particular polymer, for the separating of a substrate and of a carrier, via traction on the film.

Another aspect of the invention relates to a traction tool on the film. According to an advantageous possibility, this tool comprises a rolling element configured so that at least one edge portion of the film can be fixed to a peripheral surface of the rolling element, with the rolling element being rotative by a rotation configured to wind the film on the peripheral surface of the rolling element.

A potential interest of the invention is to profit from the presence of the film in order to be used as a disjoining vector of the substrate relatively to its carrier. The film possibly as such produces two functions, which are very different, and avoids having recourse to complex techniques for separating substrate and carrier.

INTRODUCTION OF THE DRAWINGS

The attached drawings are provided by way of example and do not limit the invention. They only show one embodiment of the invention and will make it possible to understand easily.

Figure 7:
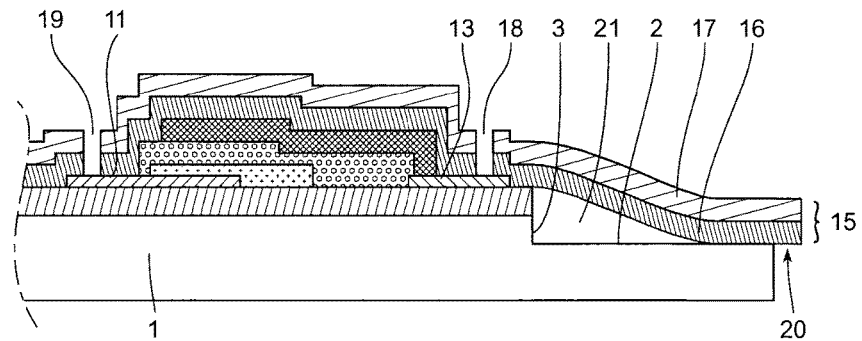
FIG. 7 is a partial cross-section view showing the succession of layers obtained as such, with the encapsulation offered by the film.
Figure 12:
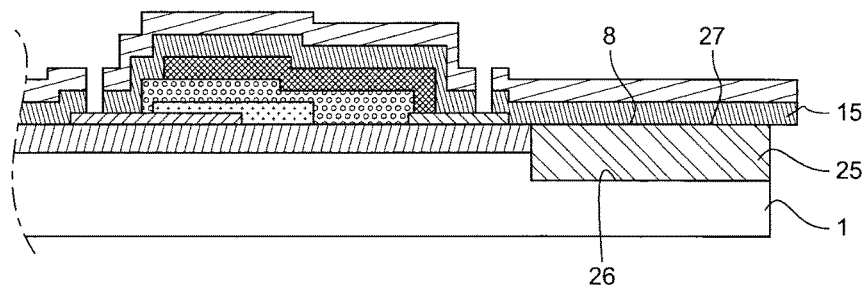
Figure 13:
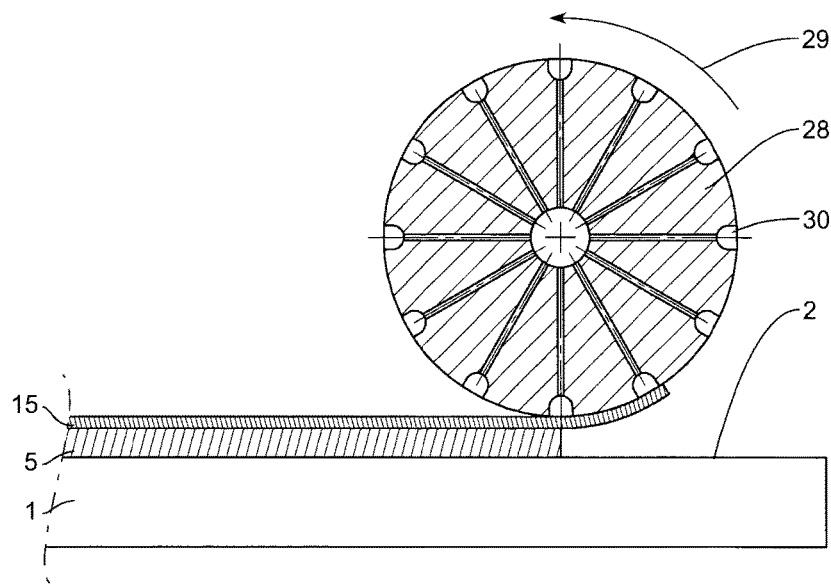
Figure 14:
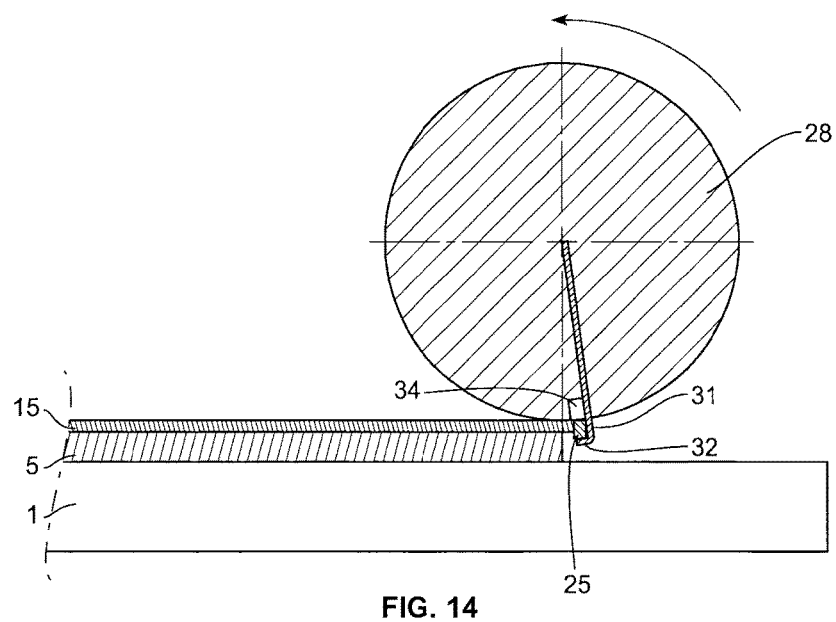
Figure 15:
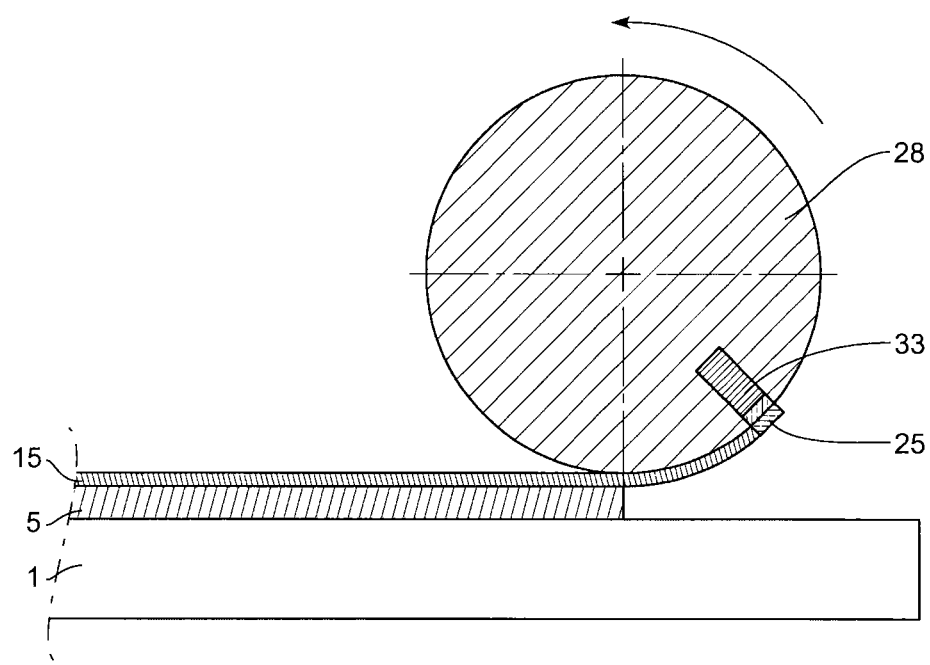

FIG. 12 offers an alternative of FIG. 7;

FIG. 13 shows a first example of a means of traction;

FIGS. 14 and 15 are two other possibilities of a means of traction on the film.

The thicknesses of the various layers shown in the figures are not necessarily to scale. In particular, the thickness of the substrate can be much less (for example by ten times) than that shown simply about three times smaller than that of the carrier.

DETAILED DESCRIPTION

Other purposes and advantages shall appear in the following description which presents illustrative but not limiting embodiments of the invention.

Before going into the details of these embodiments, briefly hereinafter preferred but not limiting alternatives are introduced that can be used alone or according to any combinations thereof, the invention is such that:

the forming of the film 15 is configured to create a portion of film 15 extending beyond the second face of the substrate 5; preferably, the overhanging portion protrudes laterally beyond the substrate 5, in such a way that it is not facing this substrate according to the thickness of the latter;

the forming of the film 15 is configured to arrange at least one space not filled with material of the film 15 above the step 3; the use of several successive steps in the peripheral zone 2 makes it possible to have several successive empty areas between the carrier 1 and the film 15 and as such favor the pulling off of the film 15 in this peripheral zone 2;

the traction force is directed according to the thickness dimension of the substrate;

the traction is carried out at several points, advantageously, these points are aligned in a plane contained in the peripheral zone 2 of the film 15;

the film 15 is configured to encapsulate the second face of the substrate 5;

the film is disjoined from the second face after traction;

the film 15 comprises at least one first layer 15 of film configured to adhere at least on the adhesion zone 7 of the second face of the substrate 5, and at least one second layer 17 of film above said first layer of film, with the at least one second layer of film comprising at least one layer sealed from the outside atmosphere, such as water and its oxidants;

in the substrate, at least one breakable zone 24 is formed, more fragile than the rest of the substrate 5, with the traction being configured to break the breakable zone 24, the electronic device comprises at least one electronic component formed from the second face of the substrate 5 at least partially after the step of assembling and before the forming of the film 15;

at least one electronic component is a capacitive stack 9 or a battery or an electrochromic component; in this case, the film 15 is advantageously transparent to the radiation of said component;

the component is encapsulated by means of the film;

the forming of the film is configured to isolate at least one component of the outside environment; the outside environment can be a space between the device and other devices and/or between the device and a case and/or a layer of atmospheric air adjoining this zone of the device.

The characteristics indicated hereinabove are only optional.

The method of the invention makes it possible to manufacture a so-called electronic device in the sense that it comprises electric parts on a carrier that can, preferably, comprise a substrate for example made of semiconductor material in particular made of glass or with a silicon base, or made of ceramic, mica, quartz or other. This can be a microelectronic device. Microelectronic means in particular all of the microelectronic and nanoelectronic techniques. The devices that can be formed can be part of systems of the micro-electro-mechanical type referred to as MEMS and/or with optical functions. This device can as such comprise components. Preferentially, it can be cells of batteries, with a base of stacks of electrodes forming capacitive assemblies. It can be simpler components, such as electrical distribution lines.

In the framework of this invention, terms such as "on" or "above" do not necessarily means "in contact with". As such, for example, the presence of one layer on another layer does not necessarily means that they are in contact. This also does not mean that the element located above the other covers it entirely.

The term "thickness" means, unless it is arranged otherwise, a dimension according to the thickness of the substrate, for example perpendicularly to the plane of a surface of the substrate. Likewise, the term "width" means, unless it is arranged otherwise, a dimension perpendicular to the thickness of the substrate.

The substrate described hereinbelow is advantageously a thin substrate, for example of a thickness between 100 and 500 µm and even less than 100 µm, generally called an ultrathin substrate. The remainder or a portion of the microelectronic members, such as cells of batteries, is carried out on the thin substrate. The term carrier or substrate carrier, or a conveyor system means in particular so-called thick substrate, the preferably have a thickness greater than 500 µm.

Figure 1:
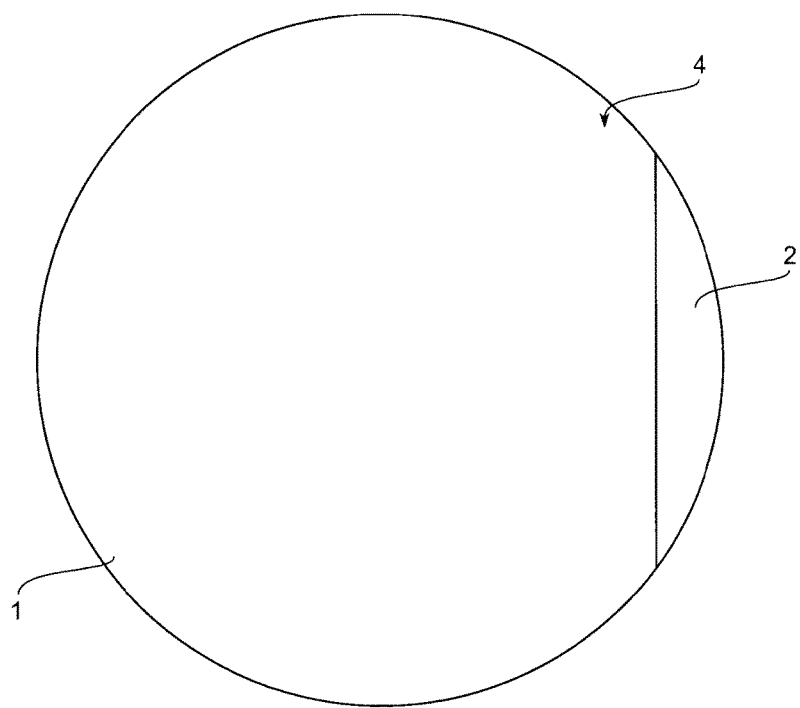
FIG. 1 is a top view of an example of a carrier.

In reference to FIG. 1, a starting element of the method of the invention is a carrier 1 for example made of glass. It can have the geometry of a plate of the "wafer" type, for example with a diameter of 200 mm or 300 mm, or that of a rectangular plate. Its thickness makes it possible preferably to have a rigidity greater than that of the substrate 5 that will be added to it. A first face of the carrier 1, also called upper face, is used to receive a first face, across from, the substrate 5. The other face 8 of the carrier can be fixed to a tool. These two faces are preferentially flat.

The first face is however advantageously configured to offer on the one hand the capacity to receive the substrate 5 and, on the other hand, to allow for a detaching of the latter by a force applied on a film 15 brought to cover the substrate 5. The steps of forming and using the film 15 are presented in detail hereinbelow. The first face of the carrier 1 comprises for this purpose preferably a first surface zone on which the substrate 5 can be joined, referred to as joining zone 4. A second zone, referred to as a peripheral zone 2 provides the contact with a portion of the film 15; it is adjacent to the joining zone 4 and allows for the overhanging of the film relatively to the second face of the substrate 5 that the film is going to cover. Advantageously, the peripheral zone 2 has a surface energy that is less than that of the joining zone 4. This lower surface energy can be produced, in particular, by a lower surface voltage, a different roughness that offers lesser adherence, a different porosity or a hydrophilic (or respectively hydrophobic) nature that is not as marked as that of the joining zone.

Figure 2:
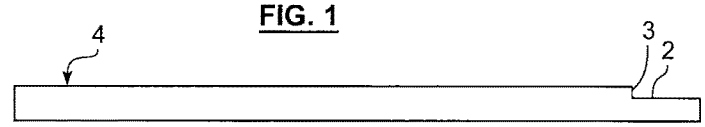
FIG. 2 is a profile view of the carrier of FIG. 1.

The modified surface energy of the peripheral zone 2 can be produced by functionalization of the first face of the carrier 1 at this location, relatively to the joining zone 4. The functionalization can be carried out by mechanical trimming methods or by a suitable surface treatment. FIGS. 1 and 2 show the functionalization by the forming of a relief, preferably a step 3, for example by micro-machining consisting in etching the step 3 on the peripheral zone 2. This specific geometric shape can also be conferred to the carrier 1 during its production. Another possibility, favored in the framework of this invention, consists in making the initially flat carrier 1 via functionalization techniques of external portions. These techniques make use in particular of machining methods via abrasion reserved for fragile materials with a high hardness such as glass. The purpose of the machining operation is to impose on the carrier 1, via removal of material, dimensions and/or a surface state (of which roughness, mechanical and physical-chemical integrity) of the peripheral zone 2. By way of example, the methods of abrasion such as rectification, grinding or polishing confer on the part a precise geometrical shape and a controlled roughness. The shape and the height of the step 3 as well as its method of production are parameters that can be adjusted according to the nature of the microelectronic devices. The step 3 created on the peripheral zone 2 preferably has a thickness greater than or equal to the thickness of the film 15. It has, in the drawings, a straight profile perpendicular to the first face of the carrier 1, but this case is not limiting and a different profile, for example a slant, can be retained. The step 3 can have a height at least two times greater than the thickness of the film 15 formed later. The height can for example be 100 µm. It is understood that the step 3 produces a peripheral zone 2 arranging a portion, typically across from the space 21 shown in FIG. 7, on which the film 15 will not be in contact, and a portion, farther away from the step 3 in the direction of the edge of the carrier, on which a contact of the film will be carried out; this configuration results, on the average a limited adherence between the film 15 and the peripheral zone, limiting as such, in other words, the global surface energy of this zone 2 relatively to the film 15.

The peripheral zone 2 preferably opens onto the edge of the carrier 1. Its width, in the plane of the first face of the carrier 1 can be about 10 times the height of the step when the latter is used.

Another manner for functionalizing the peripheral portion 2 is based on the techniques of surface treatment. The target objective is to modify the surface energy of a portion or of all of the protruding zone in order to render it unfavorable to the adhesion of the film 15. The surface treatment can be chosen according to the nature of the laminating adhesives used for the film 15 and of the material constituting the thick carrier 1. It includes all of the techniques that make it possible to reduce the forces of gluing such as the methods of thin layer depositing, plasma treatment and etching or mechanical or chemical abrasion. Mention can be made by way of example of thin layer deposits of perfectly stoichiometric composition characterized by the absence of OH type dangling bonds.

In the case of FIGS. 1 and 2, the peripheral zone is a zone delimited by a cord drawn from the circular edge of the carrier 1 and by a portion of this edge. Other forms are possible. For example, the peripheral zone can form a closed contour around the joining zone 4 in such a way as to fully girdle it. In addition the peripheral zone 2 can be in several surfaces placed at different locations of the first face of the carrier. Finally, FIG. 12 disclosed in detail further on shows that the peripheral zone 2 can, at least partially, be formed on a movable part of the carrier 1, in the form of a shim. The shim is chosen advantageously from a material that favors the adhesion with the film 15 and for example from the same material as the substrate 5.

Figure 3:
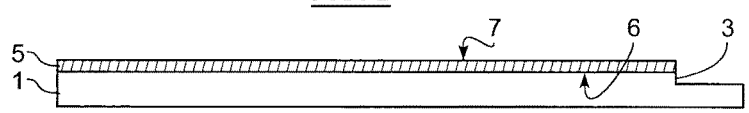
FIG. 3 is a profile view showing an assembly of a substrate that is thinner than the carrier on the latter.

The joining zone 4 receives, by its first face, a complementary joining zone 6 of the substrate 5, as is shown in FIG. 3. This substrate 5 is advantageously thinner than the carrier 1 and can be of the same nature, for example made of glass or not. Substrate 5 here means not only the substrate base 5 shown in FIG. 3 but also globally the components that will possibly be formed on this basis, such as capacitive stacks 9 for example. The adhesion zone 7 of the second face of the substrate 5, on which the film 15 will be deposited, therefore potentially comprises surfaces of these components. In particular, the upper surface of the components can participate in the adhesion zone 7. The substrate base 5 such as shown in FIG. 3 and serving as a carrier for the carrying out of the microelectronic components is here geometrically set back with respect to the carrier 1, in the sense that it does not cover the step 3. Consequently, it naturally has an additional step defined by its thickness. In this example, the substrate 5 has the same shape and the same dimensions as the joining zone 4.

The substrate 5 can be fixed on its carrier 1 by using various techniques known in prior art. As an indication, the temporary fastening by application of an electrostatic field without recourse to an electrode is one of the preferred techniques that has the particularity of being compatible with regards to the application of micro-batteries. This technology allows indeed for a fastening even in unfavorable temperature or chemical environment conditions, which are typically encountered for the manufacture of micro-batteries, with annealing and chemical etching in particular. By exposing the assembly formed by the substrate and the carrier to the electrostatic field, opposite charges are formed at the interface of the two parts, for example two glasses, and tend to reinforce the attraction of the surfaces and the quality of the clamping. The clamping protocol consists in then laminating the substrate 5 on the carrier 1 while still flushing the air between the two parts in order to prevent the formation of bubbles. Controlling the laminating protocol guarantees good adherence between the two surfaces.

According to an embodiment, the assemblies are formed by electrostatic clamping of the glass materials AF32® from the company SCHOTT AG, which have a roughness RMS (Root Mean Square) that is preferentially less than or substantially equal to 1 nm. The thermal and mechanical characteristics are respectively expressed by the values of coefficient of thermal expansion at $3.2 \times 10$ $K^{-1}$ and Young's modulus at 74.8 $kN/mm^2$. The thickness of the carrier 1 is about 500 µm although that of the substrate 5 here made of glass is 50 µm. Having an exterior surface free from any trace of pollution and foreign particles imposes frequent cleaning. The operation of suppressing the organic and particulate residues consists for example in soaking the two glasses in detergent baths (soap) and ultrasound (2 minutes) followed by water rinsing methods before proceeding with the drying under air of the surfaces. These sequences of cleaning/rinsing/drying operations can be repeated many times until the total elimination of residue. A high voltage charge of 5 kV with a positive polarity is applied to the surface of the carrier 1 including the peripheral zone 2 by using an electrostatic high voltage charger. In parallel, an equivalent charge with inverted polarity is applied to the contact surface of the substrate 5. The putting into contact of the two glasses by a suitable laminating method (such as a pressure of 1 to 3 bars and a speed of about 0.5 m/mn) allows in the end for the carrying out of the assemblies according to the configuration of FIG. 3.

At this stage, the substrate 5 is therefore temporarily fixed on the carrier 1, as in FIG. 3.

Figure 4:
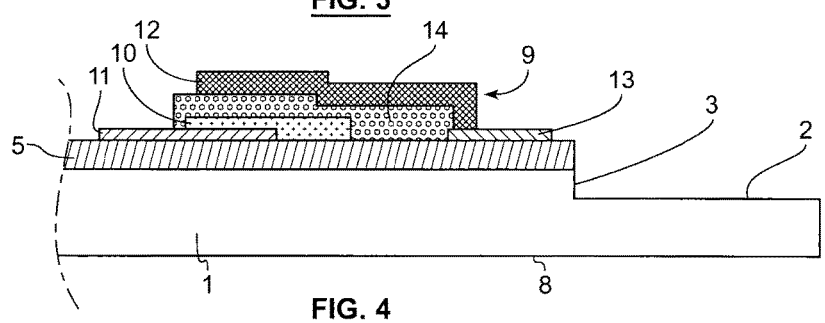
FIG. 4 is a partial cross-section view showing the manufacture of an electronic component in the substrate portion, in the form of a simple capacitive stack.

FIG. 4 shows that an electronic component has then been manufactured, or more generally formed, with the components able to be carried out by stacking of various active layers. The forming of the component means any step or series of technological steps making it possible to achieve a presence of said component on the substrate. This can be a complete or partial manufacture from a substrate or a complete or partial carry-over on the latter.

In the example of FIG. 4, connectors 11, 13 were carried out, for the electrical connection of each one among two electrodes 10, 12 stacked and spaced apart from one another by an insulator 14. The normal techniques for manufacturing capacitive cells can be implemented, in particular with methods of depositing (vacuum depositions chemically or with vapor for example) and etching (chemical or plasma for example). The conducting and insulating material used can be conventional.

The stack 9 of an elementary battery shown in FIG. 4 can be constituted of cathodic and anodic current collectors (in the form of connectors 11, 13 in FIG. 4) in particular of a metal nature (Titanium, Gold, Aluminum platinum, tungsten or any other metals used as a collector) arranged on the substrate for example made of glass AF32®. The active layers of the micro-battery here designate the electrodes, negative and positive 10, 12 and the electrolyte which is the insulator 14 located between the two electrodes. The positive electrode 10 (cathode) is preferably made of a material having good electronic and ionic conductivity (for example: TiOS, TiS2, LiTiOS, LiTiS2, LiCoO2, V2O5). The electrolyte is an electronic insulator with a strong ionic conductivity (for example: LiPON, LiPONB, LiSiCON). The negative electrode 12 is a layer can be constituted exclusively of metal lithium from a material that is knowingly lithiated. The configuration of FIG. 4 is provided as an indication in order to show the principles of this invention.

Figure 5:
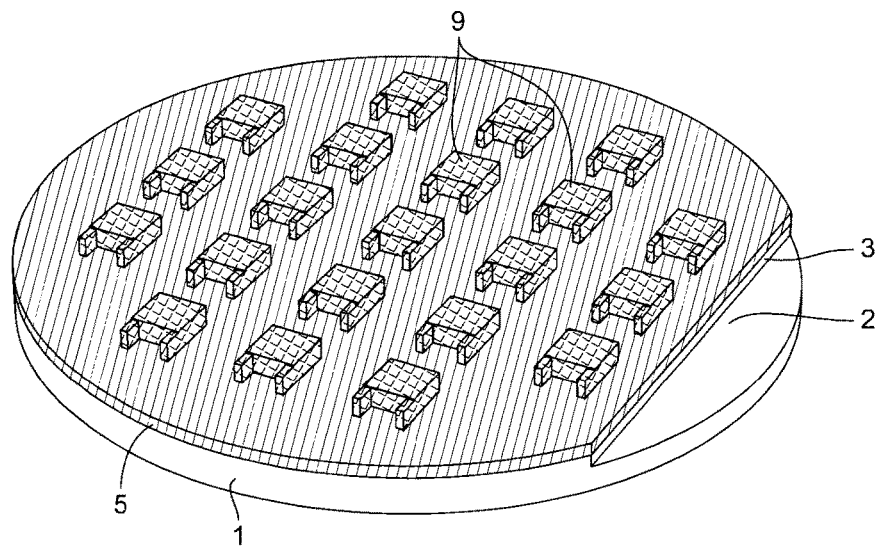
FIG. 5 shows in perspective a set of components distributed over a face of the substrate.

FIG. 5 shows a potential result, with a plurality of components 9 on the upper surface of the assembly.

These steps are then supplemented by an encapsulation based preferentially on the techniques of laminating. A film is formed above the substrate 5, on an adhesion zone 7 of the film 15, now including the electronic components. It is not absolutely necessary that the film 15 cover all of the second face of the substrate 5 as in FIG. 6 but it is of course desirable that the covering insulate effectively at the least the components from the outside environment.

Generally, the film 15 is a part, preferably with a base or made from polymers, and forming a flexible layer above the substrate. Advantageously, the film 15 is chosen from the range of humidity and oxygen barrier films. This can for example be multilayer system formed by alternating adhesive layers and barrier layers. In the case of figures, the film 15 comprises a first layer 16 providing the adhesion and a second layer 17 able to more specifically have a barrier function to water and/or to gases. According to the cases of application, it may be useful to use highly conformable encapsulation systems that make it possible to accommodate the relative surface topography at the different steps and reliefs formed at the contacts of the various elements to be covered. The adhesive force of the film 15, in its layer 16 used for the adhesion, with regards to the substrate 5 including the microelectronic component or components 9 is preferably at a minimum two times greater than the adhesive force created by the carrier assembly 5 and carrier 1.

Examples as an indication are provided hereinafter in a more precise manner for this encapsulation. The encapsulation film 15 is selected substantially for its barrier properties but also for its mechanical properties. Indeed, one of the specificities of encapsulation films relates to their properties for accommodating the topography formed by the assembly of the three elements (stack of components, thickness of the substrate 5, height of the step 3). In practice, the film 15 can include one or several barrier layers and a layer of adhesive that allows for its gluing onto the components manufactured on the substrate 5. The method of gluing calls upon for example techniques such as laminating or sealing. It is desired that the adhesive force between the film 15 and the various surfaces (components, substrate, and possibly a portion of the peripheral zone 2) are greater than the adhesive force created during the electrostatic clamping operation between the substrate 5 and the carrier 1.

The film 15 can have the form of a strip constituted of a single homogeneous layer or in the form of a heterogeneous multilayer. It is optionally chosen in the family of materials with a high barrier to oxidizing elements present in the atmosphere. The metal strips (thickness less than 300 μm) with an aluminum base or with a steel base (tin plate, black iron, chromed iron, stainless steel, etc.) are typical examples for carrying out this film 15. Optionally, these strips can be coupled with thermoplastic films with a thickness less than 100 μm (PEN, PET, PP, PI, etc.) which make it possible to reinforce the mechanical resistance of the encapsulation system.

The encapsulation system recommended is provided with a layer acting as an adhesive of which the thickness is deliberately fixed according to several parameters: thickness of the stack 9, height of the step, diameter of the peripheral zone 2. This confers on the encapsulation system the property of conformability which as such guarantees an effective protection of the active layers of the stacks 9. The adhesive can be chosen with priority for its properties of gluing, electrical insulation and chemical compatibility with the active layers of the substrate 5 and of its components, such as stacks 9. It can be sensitive to the pressure, temperature or UV radiation. It is obtained for example from polymer films with an acrylic, silicone, or rubber base or a mixture of these materials. Optionally, the adhesives used can be filled with particulate inclusions or energy absorbers of oxygen and water that make it possible to improve their seal.

According to an embodiment, the film 15 comprises an aluminum complex (20 μm thick) and PET (25 μm thick), for the layer 17. The adhesive film of the layer 16 is in particular thermosetting with a thickness of 25 μm. These films can be laminated over the underlying assembly. Typically, the conditions for laminating are chosen at 90° C. for the temperature, at 1 bar for the pressure and at 5 cm/s for the speed. The carry-over encapsulation film 15 is in direct contact with the substrate 5 and with all of the components that it carries as well as a portion or the entirety of the peripheral zone 2. The laminating operation is advantageously carried out in such a way as to extend beyond a portion of the film 15 with respect to the dimensions of the carrier 1 forming as such a tab for example of a few millimeters in the form of an edge portion 20 in FIG. 7. This effect is used to carry out the operations of the later separation of the substrate 5 relatively to the carrier 1.

The method of laminating is implemented so as to have the adhesive portion of the encapsulation film 15 correspond with the active layers of the microelectronic components (typically their upper zone protruding relatively to a plane of the second face of the substrate 5), a portion of the substrate 5 outside of the components and a portion of the carrier 1 including the peripheral zone 2. In clear, the encapsulation system has a portion overhanging the substrate 5 containing the microelectronic components, in such a way as to also cover a portion at least of the carrier 1 and in particular a portion at least of the peripheral zone 2. It can also extend beyond the carrier 1, as shown by the position of the edge 20 of the film 15 in FIG. 7. This figure also shows that the step 3 of the carrier preserves a space 21 between the film 15 and a portion of the peripheral zone 2. In this space, no contact between the film and the carrier 1 is produced and this corresponds to a zone from which the film can be removed easily.

Figure 6:
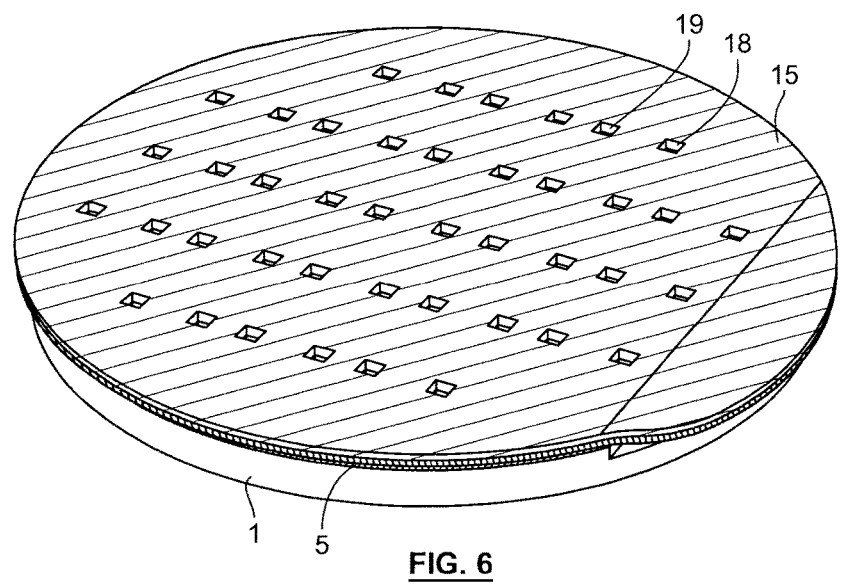
FIG. 6 shows, based on the example of FIG. 5, the covering by a film used to encapsulate the substrate.

At the end of the method of laminating, the microelectronic components carried out on the substrate 5 fixed beforehand on the carrier 1 are entirely encapsulated from oxidant species. According to the applications, in particular in the case of the capacitive stacks 9 shown, it may be necessary to produce accesses for the electrical connection of components, through the film 15. FIGS. 6 and 7 show examples of such accesses. For example, FIG. 7 shows an access 18 through the film 15 in order to access the connector 13 and an access 19 in order to access the connector 11. The accesses are for example perforated holes with a section suited for making the contact desired. The perforation of the film is in particular made by laser etching or by mechanical removal. Advantageously, these openings offer an alignment solution during the method of carry-over and make it possible to overcome the forming of bubbles during laminating methods.

When the steps of manufacturing on the substrate 5 are terminated, this entails disjoining the latter from the carrier 1.

The method for separating the substrate and the carrier 1 can for example comprise a step consisting in applying a traction movement of the film 15 on the parts that it covers. The force applied is preferably such that it overmounts the joining force of the substrate 5 and of the carrier 1. Its direction 22 preferably has a non-zero component, advantageously majority, according to a direction perpendicular to the plane of the second face of the substrate 5. A trajectory of movement applied to the film by its edge makes it possible to produce this separation force and this trajectory tends preferentially to move the edge of the film away from the substrate 5. In practice, the angle formed by the trajectory of this movement with the plane of the peripheral zone 2 of the carrier 1 can be greater than 0° and substantially equal to 90°.

The traction force introduced is oriented preferentially according to a vertical axis with a pulling from the bottom upwards. The location or locations of application of this force can correspond to zones (punctual or linear or surface) for grasping the tab forming the portion 20. For example, two zones can be distributed at equal distance from the middle of the width of the tab. Optionally, it is possible to multiply the points of application of the force in order to reinforce the extent of the traction force. It is possible that at least one zone of application of force be located at a corner of the film, for example at two successive corners of the film 15, in such a way as to solicit the entire film during traction.

Figure 8:
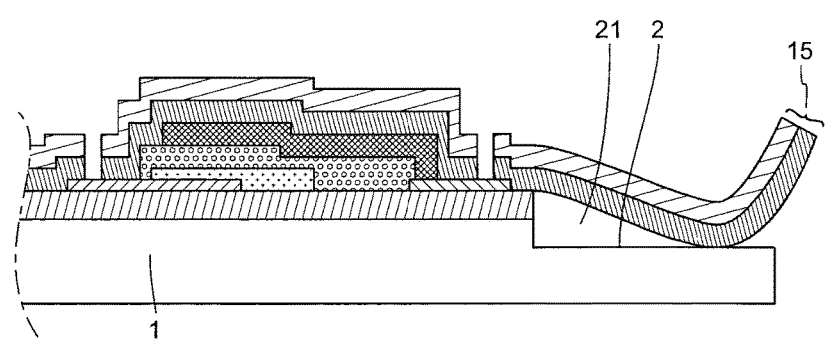
FIG. 8 shows a step of disjoining of the substrate relatively to the carrier.
Figure 9:
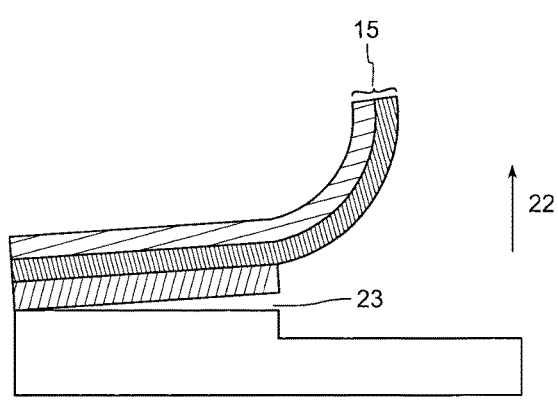
FIG. 9 shows that a traction on the film disjoins the substrate relatively to the carrier.

In addition, the adhesive force on the interface formed by the film 15 and the substrate 5 that embark the components is advantageously stronger than the adhesive force on the interface created by the contact between the adhesive portion of the film 15 and the peripheral zone 2 of the substrate 5. Furthermore, the peripheral zone 2 preferably fulfils the role of a primer zone of the film 15 during the method of separation. This priming is favored by the presence of a space 21 as in FIGS. 7 and 8. The volume generated by this empty zone has the particularity of being adjustable. Concretely, this volume can be modulated by adjusting several parameters (such as the thickness of the film 15, the thickness of the substrate 5, the step 3 of the peripheral zone 2) as such making it possible to facilitate the disjoining procedure. FIG. 9 shows the beginning of the disjoining produced by traction on the film, with a disjoining zone 23 which will progressively correspond to the entire original joining zone 4.

The value of the disjoining force to be applied depends on the force of resistance to the interface decohesion of the assembly produced between the carrier 1 and the substrate 5 during the preliminary method. In practice, the nature and the surface condition of the materials, such as glasses, used in the manufacture of the substrates 5 and carriers 1 are parameters that can be used to adjust the force of the clamping and consequently the reliability of the unclamping. Concretely, the differences in coefficient of thermal expansion and in Young's modulus between, on one side the substrate 5 and, on the other, its carrier 1 can imply a non-homogenous mechanical stress of the two materials, synonym of the reduction of the adherence and of the failure of the assembly. In order to reduce this stress intrinsic to the assembly, it is preferred to use materials with a value of coefficient of thermal expansion and of Young's modulus that are close as possible to one another, in particular with tolerance thresholds between 0 and 10%. As such, the carrier 1 can be chosen in the same family of materials as the substrate 5. By way of non-exhaustive examples, glasses coming from the borosilicate family can be used. It is possible also to use the derivatives of borosilicate products such as borosilicate glasses without alkali or boro-aluminosilicate-alkalino-earth glasses from alkaline rare earths. On the other hand, the joining of the carrier 1 and of the substrate 5 can be improved by the application of a cleaning of the two surfaces before the fixing operation. This cleaning consists for example in carrying out soakings in soapy baths followed by ultrasound. The chaining of the cleaning operations makes it possible to reduce the roughness of the contact surfaces of the two surfaces to be assembled by removal of the particulate defects inherent for the clamping method.

Thermal glasses can also be favored which have a high resistance to heat and to changes in temperature while still guaranteeing very good thermal conductivity through the assembly (carrier 1/substrate 5), for the carrying out of batteries for example. The choice of materials of the substrate and carrier can be according to optical or dielectrical properties specific to other applications such as components coming from the technology of organic electronics.

In the case of a carrier and substrate made of glass, the peeling movement of the film 15 made of polymer can be carried out with dedicated equipment. The base formed by the carrier 1 and the substrate 5 containing the electronic components protected by the film 15 is maintained via an vacuum aspiration. According to FIG. 8 and preferably, this movement at least partially perpendicular to the thickness of the film 15 and/or of the substrate 5 oriented from the bottom upwards (i.e. opposite the carrier 1) is initiated on the tab of the edge 20 with an angle of 90° C. and a force of 6 N/cm (corresponding to a surface tension) according to a constant speed of 300 mm/mn. As such, the peeling force F is very low compared to the breaking force of the film 15 with respect to the substrate 5 made of glass, in particular of the type AF32® and its components. After initiation of the breaking according to the diagram of FIG. 9, the cracks materialized by the element 23 propagating on the interface formed. These cracks are characterized by an angle between carrier and substrate that increases progressively with the speed of solicitation that governs the traction 15. In this case, the film 15 remains joined solely and entirely with the substrate 5 made of glass AF32® comprising all of the components manufactured.

FIG. 13 shows an example of means that can be used to carry out the traction on the film 15. A rolling element 28 comprises an outside surface preferably cylindrical and able to carry out a rolling on the upper surface of the film 15. Preferably, the length dimension of the element 28 is at least equal to the corresponding dimension of the film 15 in such a way that the latter can come into contact along its entire dimension with the element 28. According to this aspect of the invention, the rolling element 28 is configured to carry out a winding of the film 15 over its circumference. Preferably, the latter is sufficiently large to authorize a complete rolling of the film 15 without overlapping of portions of the film around the element 28. Typically, the element 28 can be positioned in an edge zone of the film 15, across from the peripheral zone 2. The cooperation priming between the rolling element 28 and the film 15 can therefore in this example be carried out in a zone wherein the film 15 is free or slightly fixed. Preferably, the rolling element 28 comprises a system configured to maintain the film 15 on its periphery.

In the case of FIG. 13, this system for maintaining comprises a plurality of mouths 30 able to be applied on the upper surface of the film 15 and cooperating with a suction circuit in such a way as to generate a vacuum onside mouths, at least for those which are facing the film 15. In particular, the suction circuit can extend in the body of the element 28 in the form of ducts and include an air vacuum member or a member for connecting to an air circuit with an outside vacuum. It is understood that, when the rolling element 28 is in the arrangement of FIG. 13, certain mouths 30 produce a suction effect of the film 15 on its edge. Then, a movement of rotation carried out according to the direction 29, advantageously producing a rotation without sliding of the rolling element 28 along the film 15 along an axis of rotation corresponding to the longitudinal axis of the rolling element, makes it possible to progressively wind all or a portion, and advantageously all, of the film 15.

Preferably, the mouths 30 are regularly distributed along the circumference of the rolling element 28 and, generally, over all of the surface that can come into contact with the film 15.

FIG. 14 shows an alternative wherein the grasping of the film 15 is carried out via a fastening of one end of the film 15. A rod 31 joined with the rolling element 28 by a proximal end and having, at a distal end, a hook 32, defines a mechanical blocking zone of the end of the film 15 relatively to the rolling element 28. In this embodiment, it is advantageous that a shim 25 be joined with the film 15 at this level in order to provide a cooperation that is rigid enough with the hook 32. As such, the shim 25 is used as an intermediate element for the attaching. Possible, a cavity 34 is made in such a way as to receive the shim 25 when the latter has been attached and comes to apply on the peripheral wall of the rolling element 28. The cavity 34 can have shapes and dimensions equivalent to those of the shim 25. The cavity 34 is advantageously placed to the right of the hook 32 in order to receive the shim 25 immediately when a rotation has been initiated. Preferably, the hook 32 is configured to be inserted into a zone located between the lower face of the shim 25 and the upper face of the peripheral zone 2. According to a possibility, the rod 31 is mobile in such a way as to carry out a retraction movement thrusting the shim 25 (or directly the edge of the film 15) against the rolling element 28 and preferentially in the cavity 34. A plurality of rods 31 and hooks 32 can be provided, extending, preferably on a regular basis, according to the longitudinal direction of the rolling element 28. A continuous element can as such be provided in such a way that the rode 31 and the hook 32 form two wings of a profile. The cavity 34 extends moreover preferably according to a longitudinal direction of the rolling element 28.

In the situation of FIG. 15, a magnetic effect is taken advantage of. The shim 25 is of a metal nature, preferably iron, and the rolling element 28 comprises an attraction portion 33, for example in the form of an insert extending towards the inside of the body of the element 28 and advantageously flush with its peripheral surface. This insert has magnetic properties configured to attract the shim 25. Alternatively, the insert can be metal and the shim magnetic. Furthermore, the two elements can be magnetic and of polarities that can attract each other. A plurality of portions 33 spaced, preferably regularly, according to the longitudinal direction of the rolling element 28 can be provided. A portion 33 extending over a wide portion can also be provided, preferably more than 50% and advantageously 100%, of the length of the rolling element 28.

In a manner alternative or complementary to the magnetic attraction, it is also possible to adjust the other effects of applying the film 15 on the rolling element 28. For example, a gluing of the edge of the film 15 on the rolling element 28 can make it possible to fix it in position and to drive the winding during the rotation according to the direction 29.

Any arrangement alternative to those described hereinabove that makes it possible to join the end of the film 15 to the rolling element 28 is possible. Furthermore, the solutions described can be combined according to all associations.

Note that an advantage of these embodiments is that the traction stresses can be distributed on the thin substrate 5. As such, the method of unclamping is facilitated and the flexibility properties of the substrate 5 and of the film 15 are preserved. The adjective "rolling" is used because of the rotation capacity that is proper to the element 28. It is not however absolutely necessary for the element 28 to be displaced according to a plane parallel to the substrate and that exert a pressing, even only by gravity, on the upper surface of the film 15 still in contact with the substrate 5.

After having proceeded with the separation of the substrate 5 relatively to the carrier 1, a possible step relates indeed to the separation of the components into unitary elements. It can for example be methods for cutting from prior art adapted to fragile glass materials such as mechanical cutting with a saw or laser cutting (CO2 laser, YAG laser, femto-second laser or excimer laser).

Figure 10:
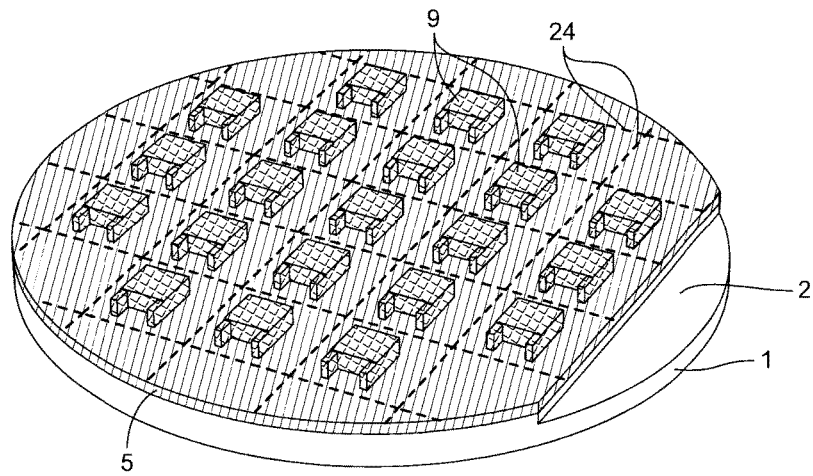
FIG. 10 shows an alternative of the example of FIG. 5.

According to a preferred embodiment, before the forming of the film 15, breakable zones 24 are carried out as in FIG. 10 on which the substrate 5 is more fragile than elsewhere. This can be zones of lesser thickness. The zones 24 preferably form a meshing that individually surrounds the components. For glass for example, a tracing is carried out by laser filamentation generating median cracks over a depth of 20 μm of the glass. The definition of the cutting lines is fixed by the dimensions of the components. This step is followed by a method for rupturing before expansion of the film 15 in order to space the components. The components are as such released from one another but in contact with the film 15.

According to an embodiment, a possibility is offered to easily separate components formed on the substrate 5. The traction carried out on the film during the separation can, in this case, participate in this step of individualization of the components. According to a possibility of implementation, tracing operations are carried out as before of the cutting paths of the substrate 5 preferably prior to the carrying out of the active layers of the components. The final result remains that of FIG. 10, before the forming of the film 15. It is possible for example to position the cutting paths according to the size of the unit components by using laser filamentation over a controlled depth between 10 and 20 μm of the substrate 5. In this case, the method of rupture makes it possible to have all of the components arranged on the film 15 during the step of traction. Optionally, the components arranged on the substrate 5 can be placed in a manner brought closer to one another in order to reduce the contact surface between the film 15 and the second face of the substrate 5. This recommendation has the advantage of reducing the gluing length of the adhesive film between the components, in particular on zones 24. Afterwards, it is sufficient to proceed with cutting the film 15 in order to individualize the components by techniques of prior art (mechanical or laser).

It can be considered to arrange the substrate 5 geometrically set back with respect to the edge of the carrier on the step 3. There is as such a double step: the step 3 and a step between a portion of the first face of the carrier 1 and the edge of the substrate 5, with the thickness of the substrate 5 determining the height of this second step. The other steps remain unchanged but this solution creates a second empty space under the film 15. Indeed, the film 15 must accommodate during the step of laminating the topography created by the double step: the second step (for example of 100 μm) is formed exclusively by the thickness of the substrate 5 and the step 3 is that which defines the peripheral zone 2 of the carrier 1.

Figure 11:
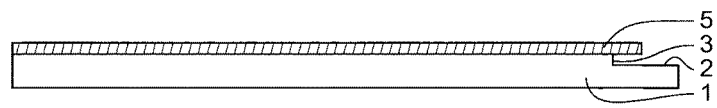
FIG. 11 shows an alternative of FIG. 3.

Inversely, in the case of FIG. 11, the substrate 5 is overhanging with respect to the internal perimeter of the peripheral zone and of the step 3. A modification then follows the empty space 21 that will not be in contact with the film 15, which can be favorable to the priming of decohesion between the film 15 and the peripheral zone 2. According to another alternative, the substrate can overhang the carrier, at least in a peripheral zone in such a way that an edge of the film overhanging the substrate is free.

Another embodiment that can be seen in FIG. 12 consists in forming a carrier with a base similar to the preceding case, but further comprising a movable portion forming a shim 25. The shim 25 produced the peripheral zone 2 on one of its faces, marked 27, intended to be in contact with the film. The opposite face 26 is in contact with the rest of the carrier 1. This shim as such produces a modified zone of the carrier 1 on which the adherence of the film is modified relatively to the adherence produced on substrate 5.

REFERENCES

1. Support
2. Peripheral zone
3. Step
4. Joining zone
5. Substrate
6. Joining zone
7. Adhesion zone
8. Second face
9. Capacitive stack
10. First electrode
11. Connector
12. Second electrode
13. Connector
14. Insulator
15. Film
16. First layer
17. Second layer
18. First access
19. Second access
20. Film edge
21. Space
22. Direction of traction
23. Disjoining zone
24. Breakable zone 25. Shim
26. First face
27. Second face
28. Rolling element
29. Direction of rotation
30. Mouth
31. Rod
32. Hook
33. Attraction portion

The invention claimed is:

1. A method for manufacturing an electronic device comprising a substrate, the method comprising:
assembling the substrate, by a joining zone of a first face of the substrate, with a joining zone of a first face of a carrier;
disjoining the substrate relatively to the carrier;
forming at least one electronic component from a second face of the substrate opposite the first face of the substrate at least partially after the step of assembling;
forming a film on the substrate, said film being configured to adhere to an adhesion zone of the second face of the substrate, an adhesive force between the film and the adhesion zone of the second face of the substrate being chosen greater than a joining force between the joining zone of the carrier and the joining zone of the first face of the substrate, with the step of forming of at least one component being carried out before the forming of the film, with the forming of the film being carried out after the assembling and being configured to cover the at least one electronic component;
after the forming of the film, operating a traction on the film with a force of traction configured to overcome the joining force, without overcoming the adhesive force.

2. The method according to claim 1, wherein the traction is carried out at least partially by traction exerted on an edge of the film.

3. The method according to claim 1, wherein the forming of the film is configured to create a portion of film overhanging the second face of the substrate, and the traction is carried out at least partially by traction on the portion of the overhanging film.

4. The method according to claim 1, wherein, on the first face of the carrier, a peripheral zone is formed adjacent to the joining zone, and wherein the forming of the film is configured so that the film adheres on the adhesion zone of the second face of the substrate and covers at least one portion of the peripheral zone, the peripheral zone being formed in such a way as to girdle the joining zone of the first face of the carrier.

5. The method according to claim 4, wherein the peripheral zone has a surface energy less than that of the adhesion zone.

6. The method according to claim 5, wherein a surface treatment is carried out on at least one portion of the peripheral zone in such a way that the at least one portion of the peripheral zone has a surface energy less than that of the adhesion zone.

7. The method according to claim 4, comprising forming at least one step between the joining zone of the first face of the carrier and the peripheral zone in such a way as to position the peripheral zone set back from the joining zone of the first face of the carrier, wherein the forming of the film is configured to arrange at least one space not filled with the material of the film above the at least one step.

8. The method according to claim 7, wherein a height dimension of the at least one step, according to a thickness of the carrier, is chosen greater than or equal to a thickness of the film.

9. The method according to claim 7, wherein the substrate is overhanging the at least one step according to a plane of the first face of the substrate.

10. The method according to claim 4, wherein the carrier comprises a shim bearing, by a first face, on a first face of an underlying portion of the carrier, at least one portion of the peripheral zone being formed by a second face of the shim, opposite the first face of the shim, and wherein the shim has a thickness equal to that of the substrate.

11. The method according to claim 1, wherein the traction force has at least one non-zero component according to a thickness dimension of the substrate.

12. The method according to claim 1, wherein the traction is carried out at several points of the film.

13. The method according to claim 12, wherein the traction is carried out by a rolling element, wherein at least one edge portion of the film is fixed to a peripheral surface of the rolling element, and wherein a rotation of the rolling element is then carried out configured to wind the film on the peripheral surface of the rolling element.

14. The method according to claim 1, wherein the film is formed by laminating.

15. The method according to claim 1, wherein the film is configured to encapsulate the second face of the substrate.

16. The method according to claim 1, wherein the film comprises at least one first layer of film configured to adhere at least on the adhesion zone of the second face of the substrate, and at least one second layer of film above said first layer of film, with the at least one second layer of film comprising at least one layer sealed from the outside atmosphere.

17. The method according to claim 1, wherein, in the substrate, at least one breakable zone is formed, more fragile than a rest of the substrate, with the traction being configured to break the breakable zone.

18. The method according to claim 17, wherein a plurality of electronic components is formed, with the components being separated by breakable zones.

19. The method according to claim 1, wherein at least one electronic component is a capacitive stack or a battery or an electrochromic component.

* * * * *